United States Patent [19]
Manning

[11] Patent Number: 5,644,540
[45] Date of Patent: *Jul. 1, 1997

[54] REDUNDANCY ELEMENTS USING THIN FILM TRANSISTORS (TFTS)

[75] Inventor: Monte Manning, Kuna, Id.

[73] Assignee: Micron Technology, Inc., Boise, Id.

[*] Notice: The term of this patent shall not extend beyond the expiration date of Pat. No. 5,392,245.

[21] Appl. No.: 390,348

[22] Filed: Feb. 17, 1995

Related U.S. Application Data

[63] Continuation of Ser. No. 106,497, Aug. 13, 1993, Pat. No. 5,392,245.
[51] Int. Cl.⁶ .................................................. G11C 7/00
[52] U.S. Cl. .................. 365/200; 365/96; 327/526
[58] Field of Search .................. 365/96, 200, 225.7; 327/526, 567

[56] References Cited

U.S. PATENT DOCUMENTS

| | | | |
|---|---|---|---|
| 4,422,161 | 12/1983 | Kressel | 365/200 |
| 4,791,615 | 12/1988 | Pelley | 365/200 |
| 5,045,720 | 9/1991 | Bae | 307/441 |
| 5,172,339 | 12/1992 | Noguchi | 365/200 |
| 5,392,245 | 2/1995 | Manning | 365/200 |

Primary Examiner—David C. Nelms
Assistant Examiner—Son Mai

[57] ABSTRACT

An embodiment of the present invention describes a redundancy repair circuit fabricated in a Static Random Access Memory (SRAM) semiconductor device, with the redundancy repair circuit comprising: a plurality of thin film transistors (TFTs); a programming pad connecting to serially connected control gates of the plurality of TFTs; the plurality of TFTs having their individual source/drain terminals connecting between substitution logic and an address multiplexer. The redundancy repair circuit is operated by a method for shifting the threshold voltages of the TFTs using a programming pad connected serially to the control gates of a plurality of TFTs; the plurality of TFTs having their individual output terminals connecting between substitution logic and an address multiplexer; selecting an individual TFT by the address multiplexer; shorting at least one of the output terminals of the selected TFT to approximately a 5 V potential; shorting the output terminals of the remaining (non-selected) TFTs to approximately a 0 V potential; and applying a programming signal to the programming pad, the programming signal is sufficient to cause the threshold voltage of the selected TFT to shift approximately 1 V by injecting electrons into the TFT's gate dielectric region while not effecting the threshold voltage of each individual said non-selected TFTs.

26 Claims, 2 Drawing Sheets

REDUNDANCY ELEMENTS USING THIN FILM TRANSISTORS (TFTS)

CROSS-REFERENCE TO RELATED APPLICATION

This is a continuation to U.S. patent application Ser. No. 08/106,497 filed Aug. 13, 1993, now U.S. Pat. No. 5,392,245, issued Feb. 21, 1995.

FIELD OF THE INVENTION

This invention relates to semiconductor devices and more particularly to the use of a thin film transistor structure as a redundancy element for circuit repair. The thin film transistor structure can be used as a redundancy repair element in integrated circuit devices and particularly in Static Random Access Memories (SRAMs).

BACKGROUND OF THE INVENTION

Typical redundancy repair uses metal fuses that require extra die space for the programming pads and cannot be programmed after the devices have been packaged. Other redundancy schemes run into difficulties when the programming voltages approach the breakdown limits of the source/drain junctions or gate oxides of the bulk devices.

A significant percentage of the cost of commodity memories is that of packaging and burn-in testing (after packaging). During burn-in, parts that were good after packaging fail for many reasons. Many of the parts fail due to the failure of individual memory bits that could be repaired if caught at wafer probe. The ability to repair failures at burn-in (or at the end-user's facility) would significantly reduce the loss at burn-in, and reduce the complexity of testing required at wafer probe (testing each die at the wafer level).

SUMMARY OF THE INVENTION

Several of the advantages of the present invention include: the ability to perform redundancy repair after packaging and after post packaging testing; the programming signal is only restricted by the TFT gate insulator integrity, thus allowing an adequate programming signal to be selected regardless of process variations; and the programming pad need not be connected to any diffusion regions, which avoids the possibility of source/drain junction or bulk gate oxide damage during programming.

One embodiment of the invention is directed to a redundancy repair circuit fabricated on a supporting substrate, with the redundancy repair circuit comprising: a plurality of thin film transistors (TFTs) or field effect transistor (FETs); a programming pad connecting to serially connected control gates of the plurality of TFTs FETs; and the plurality of TFTs FETs having their individual output terminals connecting between substitution logic and an address multiplexer.

Another embodiment of the invention is directed to a method for shifting the threshold voltages of thin film transistors (TFTs) fabricated on a supporting substrate, with the method comprising: using a programming pad that is connected serially to the control gates of a plurality of TFTs; the plurality of TFTs having their individual output terminals connecting between substitution logic and an address multiplexer; selecting an individual TFT by the address multiplexer; shorting one of the output terminals of each selected TFT to a first potential; shorting one of the output terminals of each remaining (non-selected) TFTs to second potential that is approximately a 5 V offset from the first potential; and applying a programming signal to the programming pad, the programming signal is sufficient to cause the threshold voltage of each selected TFT to shift by injecting charge into the TFT's gate insulation region while not affecting the threshold voltage of each individual non-selected TFT.

DETAILED DESCRIPTION OF THE INVENTION

A preferred embodiment of the present invention is directed to a circuitry and use of the circuitry wherein a plurality of thin film transistors are used as redundancy repair elements that can be used in a variety of integrated circuits (ICs) and in particular an SRAM device.

High density SRAMs use TFTs as load devices in the memory cell. Therefore, the use of the TFTs as redundancy elements entails no additional or special processing beyond that required for conventional SRAM fabrication.

As one skilled in the art would readily recognize, the conductivity types selected for doping the substrate and forming the redundancy TFT devices may be reversed to create either n-channel TFT device or a p-channel TFT device if so desired. As one skilled in the art will also recognize, the voltages described concerning the programming of a p-channel TFT in the following discussion would need altered in order to program an n-channel TFT.

Figure 1:
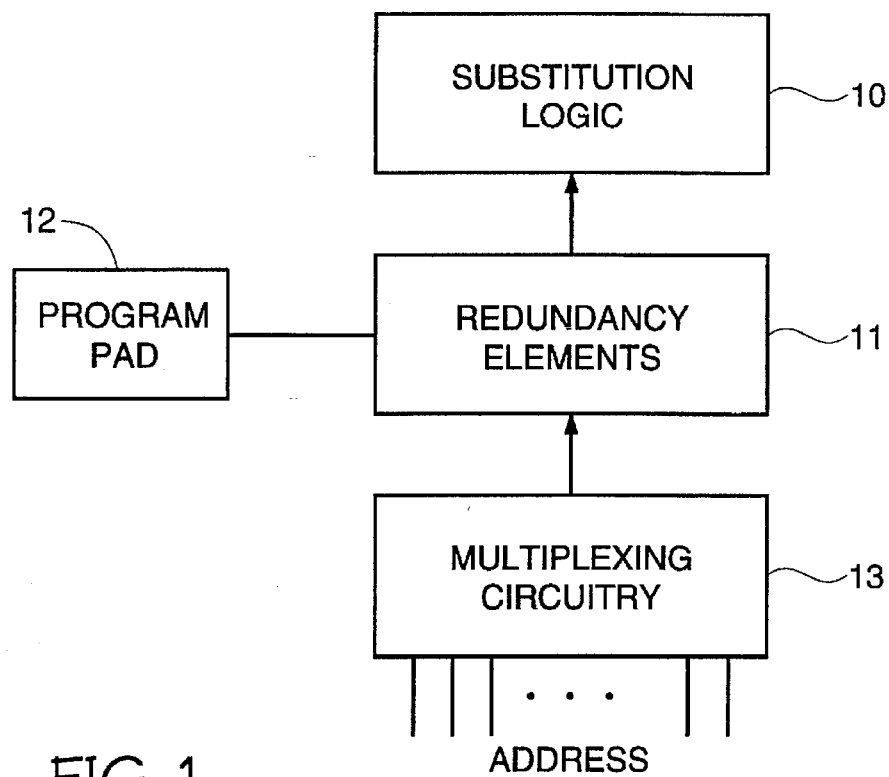
FIG. 1 is a box diagram depicting the present invention.

Referring now to FIG. 1, a general concept of the present invention is depicted in block diagram form. Multiplexing circuitry 13 decodes the user defined addresses to determine which redundancy elements are to be selected for programming. Substitution logic 10 selects which redundant rows and/or columns in the memory that are to be replaced based upon the programming of the redundancy elements 11. Redundancy elements 11, connect between substitution logic 10 and multiplexing circuitry 13 and also have a common connection to program pad 12.

Figure 2:
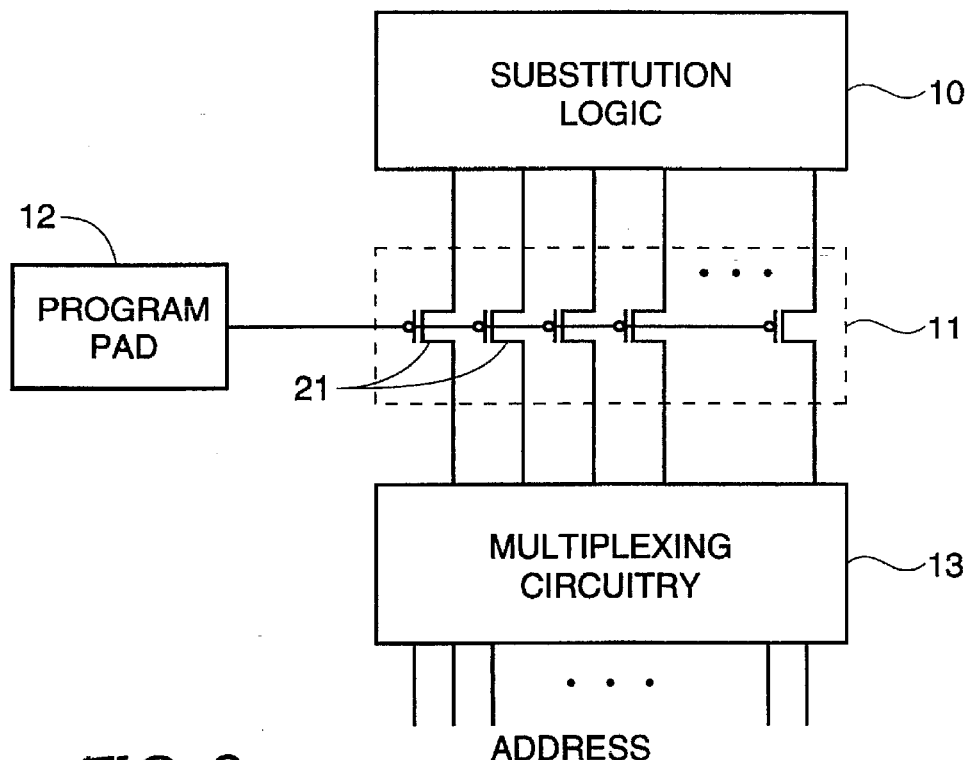
FIG. 2 is a somewhat more detailed schematic of the present invention.

Referring now to FIG. 2 and in light of the preferred embodiment of the present invention, redundancy elements 11 are made up of an array of p-channel field effect transistors 21, and in particular thin film p-channel field effect transistors. The source/drain terminals of each transistor 21 connect between substitution logic 10 and multiplexing circuitry 13. A common control gate connects to each transistor 21 and program pad 12.

A redundancy element is programmed by selecting the desired transistor 21 via multiplexing circuitry 13 with the proper location address (addressing is a typical method of selecting a desired memory location such as in an SRAM device). The address may be provided by using the standard address pins of the memory while placing the device (or chip) in a programming mode. In this mode, the on-chip logic routes the address to multiplexing circuit 13 instead of attempting to access the memory array. One or both of the selected redundancy element's source/drain terminals is then pulled high (typically 3–5 V or to the device's operating supply) and the non-selected element's source/drain terminals are pulled low (typically 0 V or ground or the operating circuitry's lowest potential). A sufficient programming signal is then placed on programming pad 12 for the necessary duration to program the selected redundancy element 11.

As an example, it has been determined that a voltage signal of approximately −30 V for a duration of approximately 6 seconds will inject enough electrons into the gate dielectric of the selected redundancy element TFT to sufficiently shift the threshold voltage (Vt) by 1 V.

Another method would be to use a current source at program pad 12 so that the selected transistor will sink the proper amount of current (and thus the voltage is self-adjusting) to provide the desired Vt shift. Using a current source will provide sufficient programming results regardless of variation that may occur in the fabrication process.

Also, it is important that a voltage potential difference of approximately 3–5 V exists between the selected transistor 21 and the non-selected transistors 21 so that only the threshold voltage of the selected transistor receives an injection of charge into its respective gate dielectric.

After programming of the selected redundancy elements is complete and the chip returns to its normal mode of operation, substitution logic 10 decodes the redundancy elements by detecting the difference in the Vt of each individual TFT by using differential amplifiers known to those skilled in the art. Substitution logic 10 uses this data to determine when to re-route the user's address to a redundant row or column to bypass defective cells of the array.

Figure 3:
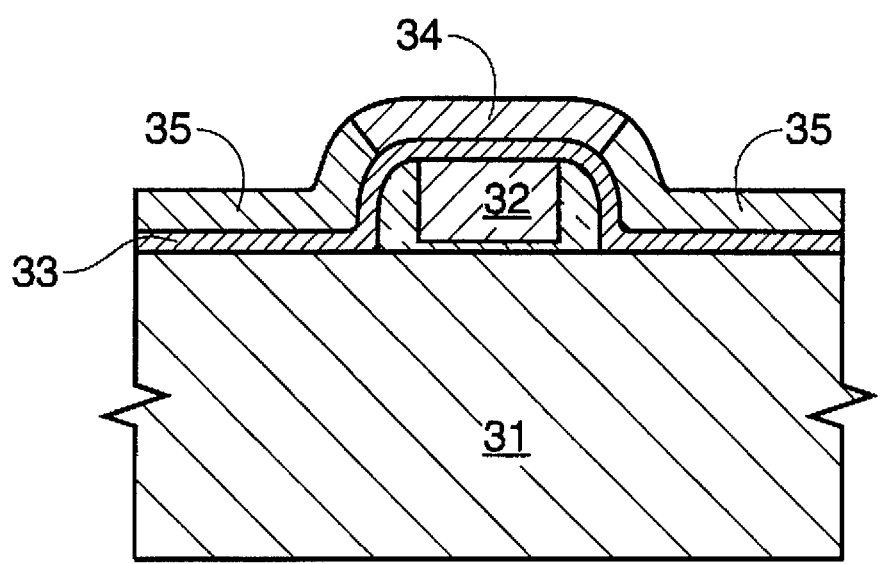
FIG. 3 is a cross-sectional view of an examplatory thin film transistor for use in the present invention.

Referring now to FIG. 3, a thin film transistor is depicted that may be used to make the array of redundancy transistors 21 of FIG. 2. A TFT is formed on a supporting substrate 31, such as silicon wafer or existing material on a silicon wafer. Control gate 32 is formed which is then covered with gate dielectric 33. Gate dielectric 33 may include such dielectrics as oxide, nitride, oxide/nitride, oxide/nitride/oxide or any combination thereof. Since gate dielectric layer will be formed by deposition it is important that the dielectric be of sufficient quality that it possesses sufficient charge injection trapping qualities as demanded in light of the present invention. The TFT is then completed by the formation and doping (techniques known to those skilled in the art) of the source/drain terminals 35 and channel region 34.

Therefore, it is to be understood that although the present invention has been described with reference to several embodiments, various modifications, known to those skilled in the art, may be made to the structure and process steps presented herein without departing from the invention as recited in the several claims appended hereto.

What is claimed is:

1. A method for using field effect transistors (FETs) as programmable redundancy elements in a redundancy repair circuit having a plurality of FETs, said method comprising:

applying a first potential to an output terminal of each FET selected for programming; and applying a programming signal to the gate of each said selected FET that is sufficient to cause the threshold voltage of each selected FET to shift by injecting charge into the FET's gate insulation region such that the shift in threshold voltage is detectable from the threshold voltage of a non-selected FET.

2. The method of claim 1, wherein said FETs comprise thin film transistors (TFTs).

3. The method of claim 1, wherein said programming signal comprises a voltage source.

4. The method of claim 1, wherein said programming signal comprises a current source.

5. A method for shifting the threshold voltages of field effect transistors (FETs) in a redundancy repair circuit fabricated in a semiconductor device, said method comprising:

using a programming pad connected serially to the control gates of a plurality of FETs;

selecting individual FETs;

shorting at least one of the output terminals of each selected FET to a first potential that is approximately at 5 V;

shorting the output terminals of the remaining (non-selected) FETs to a second potential that is approximately 0 V and thereby producing an approximate 5 V offset between said first and second potentials; and applying a programming signal to said programming pad, said programming signal is sufficient to cause the threshold voltage of each selected FET to shift approximately 1 V by injecting electrons into the FET's gate dielectric region while not effecting the individual threshold voltage of each said non-selected FETs.

6. The method of claim 5, wherein said FETs comprise thin film transistors (TFTs).

7. The method of claim 5, wherein said first potential comprises the semiconductor device's operating potential.

8. The method of claim 5, wherein said second potential comprises the semiconductor device's ground potential.

9. The method of claim 5, wherein said programming signal comprises a voltage source.

10. The method of claim 5, wherein said programming signal comprises a current source.

11. The method of claim 5, wherein said method is performed after said semiconductor device is packaged.

12. The method of claim 6, wherein said TFT's gate dielectric comprises at least one dielectric layer selected from the group consisting of oxide or nitride.

13. The method of claim 5, wherein said output terminals comprise source and drain terminals.

14. The method of claim 5, wherein said semiconductor device comprises a Static Random Access Memory (SRAM) semiconductor device.

15. A method for using p-channel field effect transistors (FETs) as programmable redundancy elements in a redundancy repair circuit, said method comprising:

applying a first potential to an output terminal of each p-channel FET selected for programming; and applying a programming signal to the gate of each said selected p-channel FET that is sufficient to shift the threshold voltage of each selected p-channel FET such that the shift in threshold voltage is detectable from the threshold voltage of a non-selected p-channel FET.

16. The method of claim 15, wherein said programming signal comprises a voltage source.

17. The method of claim 15, wherein said programming signal comprises a current source.

18. A method for shifting the threshold voltages of p-channel field effect transistors (FETs) in a redundancy repair circuit fabricated in a semiconductor device, said method comprising:

using a programming pad connected serially to the control gates of a plurality of p-channel FETs;

selecting individual p-channel FETs;

shorting at least one of the output terminals of each selected p-channel FET to a first potential that is approximately at 5 V;

shorting the output terminals of the remaining (non-selected) p-channel FETs to a second potential that is approximately 0 V and thereby producing an approximate 5 V offset between said first and second potentials; and applying a programming signal to said programming pad, said programming signal is sufficient to cause the threshold voltage of each selected p-channel FET to shift approximately 1 V by injecting electrons into the p-channel FET's gate dielectric region while not effecting the individual threshold voltage of each said non-selected p-channel FETs.

19. The method of claim 18, wherein said first potential comprises the semiconductor device's operating potential.

20. The method of claim 18, wherein said second potential comprises the semiconductor device's ground potential.

21. The method of claim 18, wherein said programming signal comprises a voltage source.

22. The method of claim 18, wherein said programming signal comprises a current source.

23. The method of claim 18, wherein said method is performed after said semiconductor device is packaged.

24. The method of claim 18, wherein said p-channel FET's gate dielectric comprises at least one dielectric layer selected from the group consisting of oxide or nitride.

25. The method of claim 18, wherein said output terminals comprise source and drain terminals.

26. The method of claim 18, wherein said semiconductor device comprises a Static Random Access Memory (SRAM) semiconductor device.

* * * * *

UNITED STATES PATENT AND TRADEMARK OFFICE
CERTIFICATE OF CORRECTION

PATENT NO. : 5,644,540
DATED : July 1, 1997
INVENTOR(S) : Manning

It is certified that error appears in the above-identified patent and that said Letters Patent is hereby corrected as shown below:

Column 4, lines 7-11, should be one paragraph.
Column 4, line 43, a new paragraph after "and".

Signed and Sealed this

Eleventh Day of November, 1997

*Attest:*

BRUCE LEHMAN

*Attesting Officer*     *Commissioner of Patents and Trademarks*